(12) United States Patent
Fitzsimmons et al.

(10) Patent No.: US 9,852,959 B2
(45) Date of Patent: Dec. 26, 2017

(54) CORROSION RESISTANT CHIP SIDEWALL CONNECTION WITH CRACKSTOP AND HERMETIC SEAL

(71) Applicant: GLOBALFOUNDRIES INC., Grand Cayman (KY)

(72) Inventors: John A. Fitzsimmons, Poughkeepsie, NY (US); Michael J. Shapiro, Austin, TX (US); Natalia Borjemscaia, Wappingers Falls, NY (US); Vincent McGahay, Poughkeepsie, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/017,004

(22) Filed: Feb. 5, 2016

(65) Prior Publication Data

US 2017/0229362 A1    Aug. 10, 2017

(51) Int. Cl.
*H01L 23/26* (2006.01)
*H01L 23/535* (2006.01)
*H01L 23/00* (2006.01)
*H01L 23/31* (2006.01)

(52) U.S. Cl.
CPC .......... *H01L 23/26* (2013.01); *H01L 23/3142* (2013.01); *H01L 23/535* (2013.01); *H01L 23/562* (2013.01)

(58) Field of Classification Search
CPC ............... H01L 23/26; H01L 23/16; H01L 2924/01079; H01L 23/3142; H01L 23/535; H01L 23/562; B81C 1/00285; B81B 7/0038
See application file for complete search history.

(56) References Cited

U.S. PATENT DOCUMENTS

| | | | |
|---|---|---|---|
| 7,517,736 B2 | 4/2009 | Mehta et al. | |
| 8,541,262 B2 | 9/2013 | Lai et al. | |
| 2015/0097257 A1* | 4/2015 | Gambino | G02B 6/122 257/432 |
| 2015/0291415 A1* | 10/2015 | Haney | B81C 1/00539 257/414 |

* cited by examiner

*Primary Examiner* — Marcos D Pizarro
*Assistant Examiner* — Long H Le
(74) *Attorney, Agent, or Firm* — Michael LeStrange; Andrew M. Calderon; Roberts Mlotkowski Safran Cole & Calderon, P.C.

(57) ABSTRACT

The present disclosure relates to semiconductor structures and, more particularly, to corrosion resistant chip sidewall connections with crackstop structures with a hermetic seal, and methods of manufacture. The structure includes: a guard ring structure surrounding an active region of an integrated circuit chip; an opening formed in the guard ring structure; and a hermetic seal encapsulating the opening and a portion of the guard ring structure, the hermetic seal being structured to prevent moisture ingress to the active region of the integrated circuit chip through the opening.

18 Claims, 3 Drawing Sheets

CORROSION RESISTANT CHIP SIDEWALL
CONNECTION WITH CRACKSTOP AND
HERMETIC SEAL

FIELD OF THE INVENTION

The present disclosure relates to semiconductor structures and, more particularly, to corrosion resistant chip sidewall connections with crackstop structures with a hermetic seal, and methods of manufacture.

BACKGROUND

Semiconductor chips are formed on a wafer. After fabrication processes are completed, the wafer is diced by cutting the wafer along kerfs resulting in the singulation of the chips, e.g., separate chips. The dicing processes is a physical process which induces stress into the chips. These stresses result in stress cracks forming through the semiconductor chip structure, which can degrade or even destroy the functionality of the chip, itself. For example, cracks typically form along interfaces between metal structures and dielectric materials, with some portions of the semiconductor structures particularly susceptible to crack propagation.

To avoid such stress cracks designers use guard ring structures to surround the active region of the chip. However, after the chip is fully fabricated, these guard ring structures can prevent the use of contacts to the outside for testing. Thus, in order to have contacts extending from the inner portion of the chip, it is necessary to go around the guard ring structure. This may result in a propagation path or moisture ingress into the chip.

Moisture greatly impacts integrated circuit reliability and performance. For example, moisture ingression during chip operational lifetime increases chip functional failure, particularly as technology scales. For example, capacitance shift due to moisture ingression (k value increases) will negatively impact performance (e.g., RC delay). Moreover, low-k interlevel dielectric (ILD) TDDB failure times, voltage acceleration, and temperature acceleration all degrade significantly with the ingress of moisture within an integrated circuit. These failures can become even more pronounced in integrated circuit designs in smaller technology nodes which do not take into consideration an increased likelihood of chip edge seal breakage due to high temperature swings or high mechanical stress generated by low-k ILD integration and high density circuit layouts.

SUMMARY

In an aspect of the disclosure, a structure comprises: a guard ring structure surrounding an active region of an integrated circuit chip; an opening formed in the guard ring structure; and a hermetic seal encapsulating the opening and a portion of the guard ring structure, the hermetic seal being structured to prevent moisture ingress to the active region of the integrated circuit chip through the opening.

In an aspect of the disclosure, a structure comprises: a guard ring structure surrounding an active region of an integrated circuit chip; an opening formed in the guard ring structure; and a shielding plate positioned between an edge of the integrated circuit chip and the opening, the shielding plate being structured to prevent propagation of cracks through the opening.

In an aspect of the disclosure, a structure comprises: a guard ring structure surrounding an active region of an integrated circuit chip; an opening formed in the guard ring structure; and a contact structure comprising a contact portion of non-corrosive metal exposed at an edge of the integrated circuit chip, the contact structure extending through the opening to an active region of the integrated circuit chip.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to corrosion resistant chip sidewall connections with crackstop structures with a hermetic seal, and methods of manufacture. More specifically, the present disclosure relates to corrosion resistant chip sidewall connections for 3D packaging with improved crackstop capabilities and a hermetic seal to prevent corrosion to components provided with a perimeter of the crackstop structure. In embodiments, the corrosion resistant chip sidewall connection can include a shielding structure and a corrosion resistant strip, the former feature which prevents or blocks cracks from entering into the active region of the chip and the latter feature which ensures that corrosion does not spread to wiring or other components of the chip.

Accordingly and advantageously, the structure described herein provides many beneficial features including, for example, the ability to block cracks from entering an open pathway of a crackstop structure, as well as a hermetic seal used to insulate wire penetrations which extend through the open pathway of the metal crackstop. The structure described herein also provides a connection (e.g., wire penetrations) from a side or edge of the chip while maintaining the hermetic seal. In this way, moisture cannot penetrate to the active and passive components of the chip, while still allowing for connections for testing, etc. For example, the structure described herein provides a corrosion resistant connection or contact (wiring penetration) from a side or edge of the chip which can be used for testing or to increase I/O connections to the outside environment. In this way, the corrosion resistant connection or contact can be used to provide additional connections, in addition to those connections provided from the top of the chip.

The structure of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC)

technology. For example, the structures are built on wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask.

Figure 1:
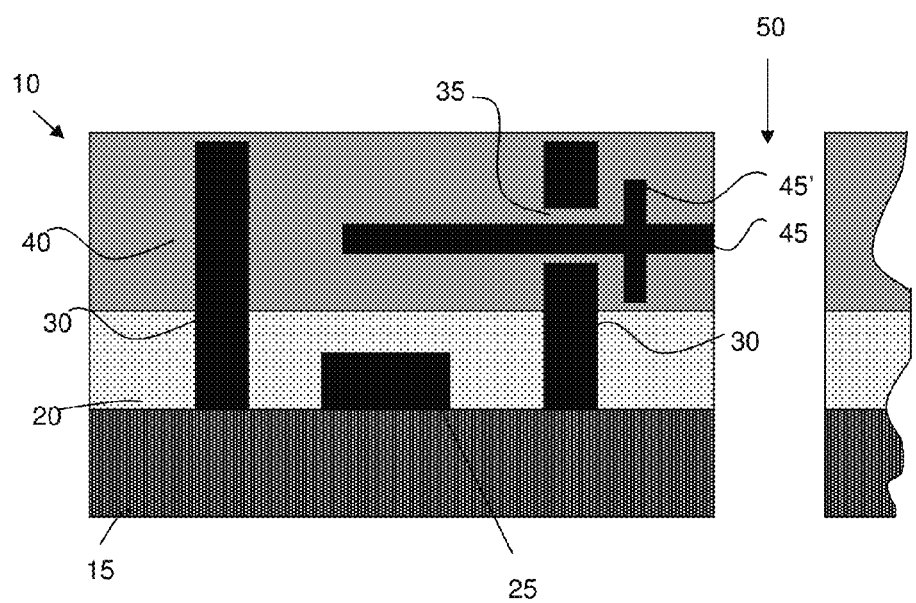
FIG. 1 shows a structure and respective fabrication processes in accordance with aspects of the present disclosure.

FIG. 1 shows a structure and respective fabrication processes in accordance with aspects of the present disclosure. More specifically, the structure 10 shown in FIG. 1 includes one or more active and passive devices 25 formed on a substrate 20. The one or more active and passive devices 25 can be, e.g., transistors, wiring structures, via contacts, resistors, or other semiconductor components. These active and passive devices 25 can be formed within a dielectric material 20. The dielectric material 20 can be an interlevel dielectric material such as, e.g., oxide or other low-k dielectric materials.

The active and passive devices 25 are formed within an active region of the chip, surrounded by a crackstop or guard ring structure 30. The crackstop or guard ring structure 30 can be copper material formed during the fabrication processes of other wiring structures within the active region. For example, the crackstop or guard ring structure 30 can be fabricated during same fabrication processes, e.g., conventional CMOS processes, of the passive devices such as via contacts and wiring structures. More specifically, the crackstop or guard ring structure 30 can be formed through the use of masking layers, e.g., resist, and the deposition and patterning of materials.

In even more specific examples, the crackstop or guard ring structure 30 can be formed incrementally upwards during formation of different wiring layers. That is, the metal material of the crackstop or guard ring structure 30 can be formed by either an additive or subtractive process, while also forming other metal structures of the chip 10 within the dielectric material 20. In the additive process, for example, the dielectric material 20 is deposited using a conventional chemical vapor deposition process (CVD), followed by lithography and etching or patterning processes (e.g., RIE) to form opening(s). The opening(s) can be filled with metal material, e.g., copper, by conventional deposition processes. These conventional deposition processes can be physical vapor deposition (PVD), Electroplating methods such as electrolytic plating or electro-less plating, atomic layer deposition (ALD) or CVD processes, as examples. Any residual material on the surface of the dielectric material 20 can be removed by a chemical mechanical polishing (CMP). These processes can continue for multiple wiring layers as should already be understood by those of skill in the art.

Still referring to FIG. 1, the crackstop or guard ring structure 30 is further formed within a hermetic dielectric material 40. The hermetic dielectric material 40 can be a nitride material or an oxide material, for example. Other hermetic dielectric materials are also contemplated herein, depending on the degree of required hermeticity. The crackstop or guard ring structure 30 can be formed in a manner similar to the lower portion of the crackstop or guard ring structure 30 formed in the dielectric material 20.

In embodiments, an opening 35 is formed in the crackstop or guard ring structure 30, within the hermetic dielectric material 40. The opening 35 can be formed by the simple deposition of hermetic dielectric material 40, without any patterning or metal deposition. In embodiments, the opening 35 is designed and structured to allow wiring penetration (e.g., wiring structure 45) into the active region of the chip, e.g., within the confines of the crackstop or guard ring structure 30. Advantageously, the hermetic dielectric material 40 will electrically isolate the wiring structure 45 from the crackstop or guard ring structure 30, thereby avoiding electrical shorts. The hermetic dielectric material 40 will also prevent moisture from penetrating to the active and passive components 25 of the chip, while still allowing for connections for testing and other purposes described herein.

The wiring structure 45 can be a copper wiring structure formed through the opening 35 and surrounded (e.g., encapsulated) by the hermetic dielectric material 40. The copper wiring structure 45 can be formed using the processes described herein, e.g., lithography, etching and deposition processes similar to that described with the formation of the crackstop or guard ring structure 30. In embodiments, the wiring structure 45 would extend to the edge of the chip. Although a single wiring structure 45 through a single opening 35 is shown, one of skill in the art would understand that multiple wirings through respective openings within the crackstop or guard ring structure 30 and extending within the hermetic dielectric material 40 are contemplated herein.

As further shown in FIG. 1, the wiring structure 45 includes a flange portion 45'. This flange portion 45' (e.g., shield plate) will block crack propagation. More specifically, by using the flange portion 45', cracks will be blocked from propagating through the opening 35 and into the active region of the chip through the opening 35. In this way, cracks will not form in the dielectric material 20, hermetic dielectric material 40 or any of the components 45 within the confines of the crackstop or guard ring structure 30, thereby ensuring proper functionality of the chip. By preventing crack propagation, moisture ingress will also be prevented.

In embodiments, the flange portion 45' has dimensions which are larger than the opening 35. For example, the flange portion 45' can have a diameter that is larger than the diameter of the opening 35, such that the flange portion 45' will overlap with the upper and lower portion of the crackstop or guard ring structure 30. In embodiments, the flange portion 45' will also be electrically isolated from the crackstop or guard ring structure 30 by the hermetic dielectric material 40. The flange portion 45' can be formed within the hermetic dielectric material 40 using conventional lithography, etching and deposition processes as described herein. The flange portion 45' is preferably the same material as the wiring structure 45, e.g., copper, and is formed between the opening 35 and an edge of the chip.

Continuing with FIG. 1, the deposition of the hermetic dielectric material 40 can extend to above the crackstop or guard ring structure 30 and the flange portion 45'. Upon completion of the deposition processes, dicing processes are performed within the dicing channel or kerf 50. As should be understood by those of skill in the art, the dicing process will singulate the multiple chips which were formed on a single wafer. The dicing process will expose the wiring structure 45 at a side or edge of the chip. As noted above, if multiple wiring structures 45 extend though respective openings 35, upon completion of the dicing, multiple wirings will be exposed at the edge of the chip. As one of skill in the art would understanding, the dicing process can cause stress on the structure, resulting in the formation of cracks. However, the flange portion 45' will prevent or block the cracks from entering through the opening 35 and into the active region of the chip.

Figure 2:
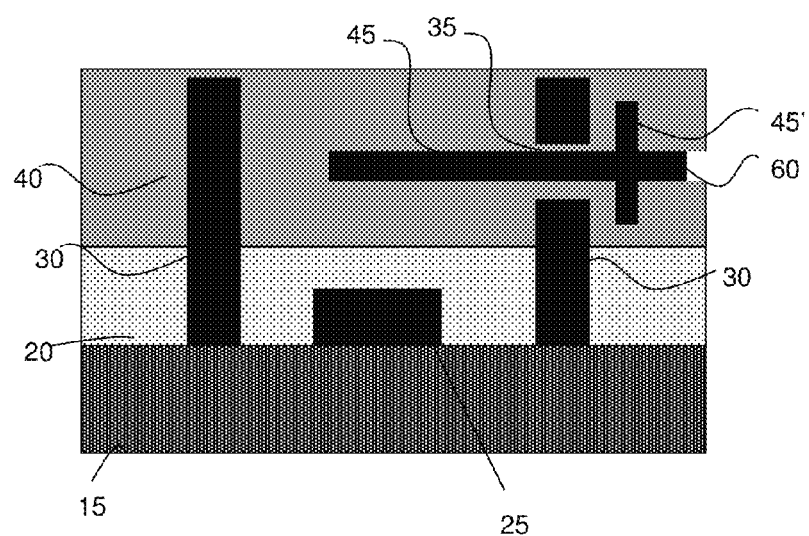
FIG. 2 shows a recessed portion of a wiring connection and respective fabrication processes in accordance with aspects of the present disclosure.

FIG. 2 shows a structure and respective fabrication processes in accordance with additional aspects of the present disclosure. For example, upon completion of the dicing operations, the exposed portion of the wiring structure 45, at the edge of the chip, can be etched back to form a recess 60. The recess 60 can be formed by an etch that is selective to copper and non-selective to other exposed surfaces in order to etch back the copper. In embodiments, any exposed dielectric and other exposed metal surfaces, e.g., some possible metal surfaces including Au, TiN, WN, Pb, Ag, Cr, Sn, and alloys containing these metals will not be detrimentally etched by such selective chemistries. In embodiments, the etchant chemistries can be those disclosed in U.S. Pat. No. 7,517,736, the contents of which are incorporated by reference in its entirety herein. In alternative embodiments, the recess 60 can also be formed by conventional lithography and etching processes, with any resist removed by conventional stripants, e.g., solvents. Alternatively, for example, the recess 60 can be formed using dilute $HNO_3$ or SC1 chemistries.

Figure 3:
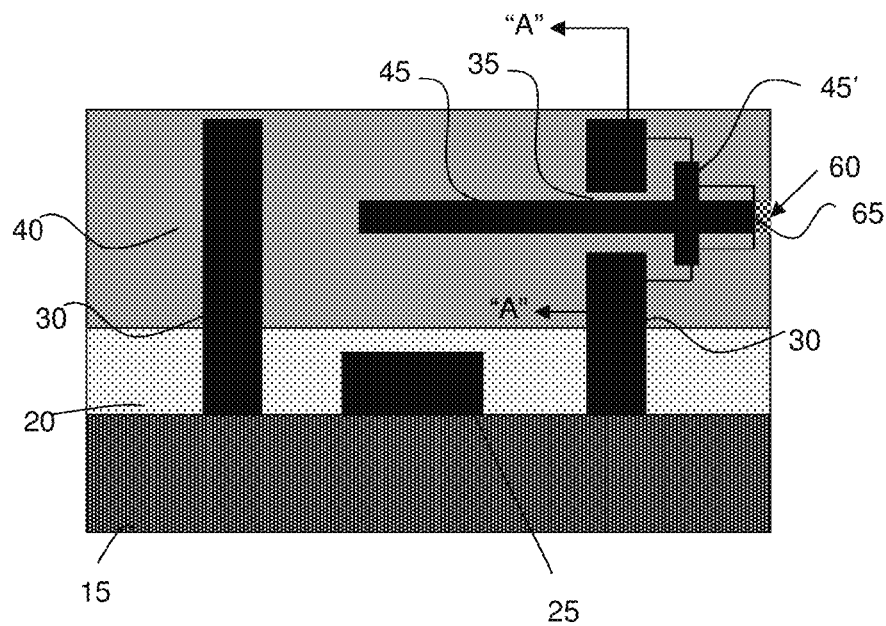
FIG. 3 shows the recessed portion filled with a noble metal and respective fabrication processes in accordance with aspects of the present disclosure.
Figure 4:
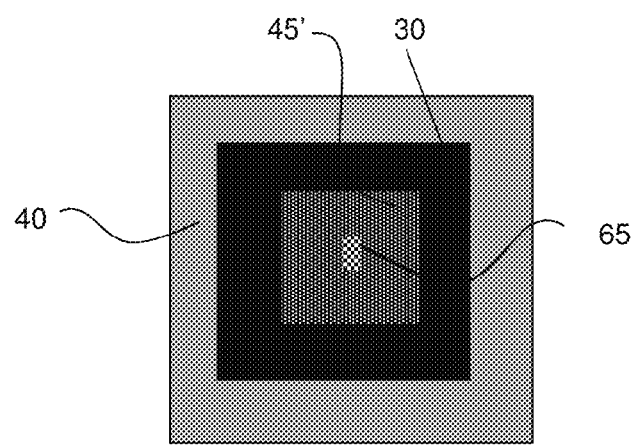
FIG. 4 shows a cross-sectional view of the structure of FIG. 3, in accordance with aspects of the present disclosure.

As shown further in FIG. 4, the recess 60 is filled with a noble metal 65 selective to the exposed, etched back material, e.g., copper, of the wiring structure 45. As should be understood by those of skill in the art, noble metals are metals that are resistant to corrosion and oxidation in moist air. Accordingly, the noble metal 65 will protect the wiring structure 45, e.g., copper, from corrosion. This, in turn, will also prevent corrosion from extending to wiring structures and other components within the active region. In embodiments, the noble metal can be deposited within recess 60 by a non-electrolytic plating process. In embodiments, the noble metal 65 can be gold. In alternative embodiments, the noble metal 65 can be ruthenium, rhodium, palladium, silver, osmium, iridium, or platinum, FIG. 4 shows a cross-sectional view of the structure of FIG. 3, along line "A"-"A". As shown in FIG. 4, the hermetic dielectric material 40 will completely surround (e.g., encapsulate) the opening (not shown) of the crackstop or guard ring structure 30, in additional to the flange portion 45' (which is covering the opening). The hermetic dielectric material 40 will also surround (e.g., encapsulate) the wiring structure 45, with the noble metal 65 extending to the edge of the chip. In this way, the hermetic dielectric material 40 will hermetically seal the components within the active region of the chip, preventing moisture ingress.

Figure 5:
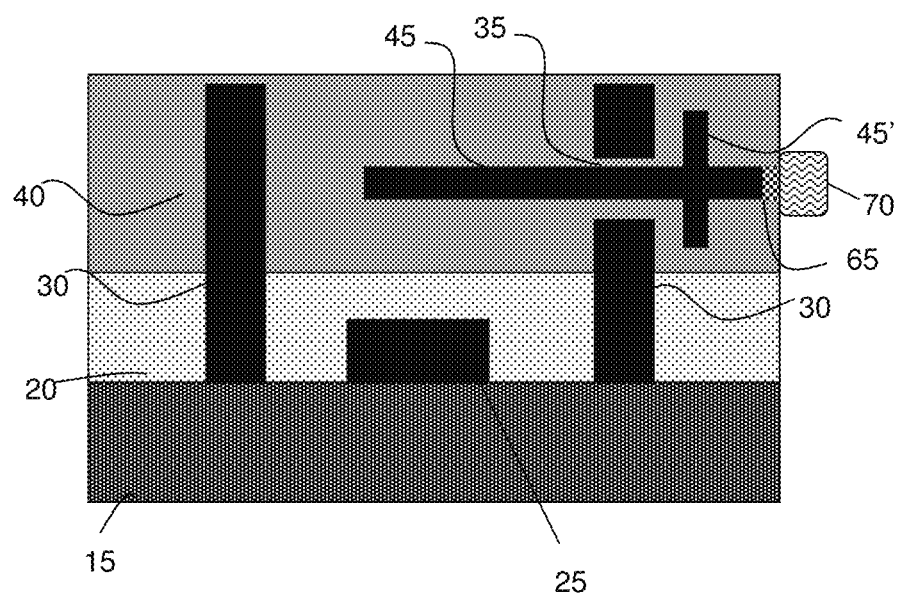
FIG. 5 shows an additional structure and respective fabrication processes in accordance with aspects of the present disclosure.

In FIG. 5, a structure 70 is electrically connected to the contact comprising the noble metal 65, e.g., in electrical connection with the wiring structure 45. In embodiments, the structure 70 can be representative of a testing probe. In additional or alternative embodiments, the structure 70 can be representative of an I/O pad. In this latter scenario, the structure 70 can provide additional connections to the chip thereby increasing the I/O density of the chip.

The method(s) as described above is used in the fabrication of integrated circuit chips. The resulting integrated circuit chips can be integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
    a guard ring structure surrounding an active region of an integrated circuit chip;
    an opening formed in the guard ring structure; and
    a hermetic seal encapsulating the opening and a portion of the guard ring structure, the heunetic seal being structured to prevent moisture ingress to the active region of the integrated circuit chip through the opening, wherein
    a contact structure extending through the opening, and a shield plate blocking the opening and which is structured to block cracks from propagating through the opening, and
    the hermetic seal is a hermetic dielectric material.

2. The structure of claim 1, further comprising a low-k dielectric material surrounding additional portions of the guard ring structure.

3. The structure of claim 1, further comprising a contact structure formed through the opening and electrically isolated from the guard ring structure by the hermetic dielectric material.

4. The structure of claim 3, wherein the contact structure extends from within the guard ring structure to an edge of the integrated circuit chip.

5. The structure of claim 4, wherein the contact structure includes a noble metal contact exposed at the edge of the integrated circuit chip.

6. The structure of claim 5, wherein the contact structure comprises a shield plate blocking the opening and which is surrounded by the hermetic dielectric material.

7. The structure of claim 1, wherein the contact structure and the shield plate are encapsulated by the hermetic dielectric material.

8. A structure, comprising:
    a guard ring structure surrounding an active region of an integrated circuit chip;
    an opening formed in the guard ring structure; and
    a shielding plate positioned between an edge of the integrated circuit chip and the opening, the shielding plate being structured to prevent propagation of cracks through the opening.

9. The structure of claim 8, wherein the shielding plate is larger than the opening.

10. The structure of claim 8, further comprising hermetic dielectric material surrounding the opening, a portion of the guard ring structure and the shielding plate, the hermetic dielectric material being structured to prevent moisture ingress to the active region of the integrated circuit chip.

11. The structure of claim 10, further comprising a contact structure extending through the opening and encapsulated by the hermetic dielectric material, the contact structure extending from the shielding plate.

12. The structure of claim 11, wherein the contact structure comprises an end contact of noble metal exposed at an edge of the integrated circuit chip.

13. The structure of claim 12, wherein the contact structure is a different material than the noble metal.

14. The structure of claim 10, further comprising a low-k dielectric material surrounding additional portions of the guard ring structure.

15. A structure, comprising:
    a guard ring structure surrounding an active region of an integrated circuit chip;

an opening formed in the guard ring structure; and a contact structure comprising a contact portion of non-corrosive metal exposed at an edge of the integrated circuit chip, the contact structure extending through the opening to an active region of the integrated circuit chip.

16. The structure of claim 15, further comprising a shielding plate extending about the contact structure and between an edge of the integrated circuit chip and the opening, the shielding plate being structured to prevent propagation of cracks through the opening.

17. The structure of claim 16, further comprising hermetic dielectric material encapsulating the shielding plate, the contact structure and the opening.

18. The structure of claim 17, wherein the contact structure and the shielding plate are electrically isolated from the guard ring structure by the hermetic dielectric material and the non-corrosive metal is a noble metal.

* * * * *